United States Patent
Yoon et al.

(10) Patent No.: US 7,973,636 B2
(45) Date of Patent: Jul. 5, 2011

(54) IMPEDANCE TRANSFORMER AND APPLICATIONS THEREOF

(75) Inventors: Seunghwan Yoon, Costa Mesa, CA (US); Jesus Alfonso Castaneda, Los Angeles, CA (US); Franco De Flaviis, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/789,677

(22) Filed: May 28, 2010

(65) Prior Publication Data
US 2010/0237974 A1    Sep. 23, 2010

Related U.S. Application Data

(63) Continuation of application No. 11/473,810, filed on Jun. 22, 2006, now Pat. No. 7,750,787.

(51) Int. Cl.
*H01F 27/28* (2006.01)
(52) U.S. Cl. .......................... 336/223; 336/200; 336/232
(58) Field of Classification Search .................. 336/200, 336/223, 232
See application file for complete search history.

(56) References Cited

U.S. PATENT DOCUMENTS

| | | | | |
|---|---|---|---|---|
| 6,097,273 A * | 8/2000 | Frye et al. | | 336/200 |
| 6,429,763 B1 * | 8/2002 | Patel et al. | | 336/200 |
| 6,608,364 B2 * | 8/2003 | Carpentier | | 257/531 |
| 6,707,367 B2 * | 3/2004 | Castaneda et al. | | 336/200 |
| 6,713,162 B2 * | 3/2004 | Takaya et al. | | 428/209 |
| 6,778,058 B1 * | 8/2004 | Branchevsky | | 336/200 |
| 6,882,263 B2 * | 4/2005 | Yang et al. | | 336/200 |
| 7,253,712 B1 * | 8/2007 | Papananos | | 336/200 |
| 7,808,356 B2 * | 10/2010 | Papananos | | 336/200 |

* cited by examiner

*Primary Examiner* — Anh T Mai
*Assistant Examiner* — Joselito Baisa
(74) *Attorney, Agent, or Firm* — Garlick Harrison & Markison (57) ABSTRACT

An impedance transformer includes a first winding and a second winding. The first winding includes a first plurality of winding components, wherein each of the first plurality of winding components is on a corresponding layer of a first set of layers of a supporting substrate. The second winding includes a second plurality of winding components, wherein each of the second plurality of winding components is on a corresponding layer of a second set of layers of the supporting substrate and the first and second sets of layers are interleaved. The first winding has a first impedance within a desired frequency range and the second winding has a second impedance within the desired frequency range, where the first and second impedances are based on at least one of spacing, trace width, and trace length of the first and second plurality of winding components.

18 Claims, 11 Drawing Sheets

IMPEDANCE TRANSFORMER AND APPLICATIONS THEREOF

CROSS REFERENCE TO RELATED APPLICATION

This application is a continuation of and claims priority to U.S. Patent Application having an application Ser. No. 11/473,810, filed Jun. 22, 2006, which application is incorporated herein by reference.

BACKGROUND OF THE INVENTION

1. Technical Field of the Invention

This invention relates generally to radio frequency (RF) communication systems and more particularly to transformers used within such RF communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

In many wireless communication devices, the transmitter and/or receiver is coupled to antenna, or antennas, by one or more transformers. Such a transformer typically includes a single-ended winding that is coupled to the antenna and a differential winding that is coupled to a low noise amplifier of a receiver section and/or to a power amplifier of a transmitter section. The transformer may be implemented in a variety of ways. For instance, the transformer may be implemented on-chip with the receiver and/or transmitter section. While an on-chip transformer provides the convenience of not requiring an external transformer, the on-chip transformer's power capabilities are limited due to its size.

Another known implementation of a transformer is a marginal type transformer that is fabricated on a printed circuit board (PCB). A marginal type transformer includes two parallel traces that each is approximately one-quarter wavelength in length. As such, a margin type transformer consumes a significant amount of PCB real estate, but does provide significant power in comparison to the on-chip transformer. As with any transformer, impedance matching between the antenna and receiver or transmitter section is an important design criterion.

Therefore a need exists for an impedance transformer that provides the power benefits of a marginal type transformer but with a more compact size of an on-chip transformer.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
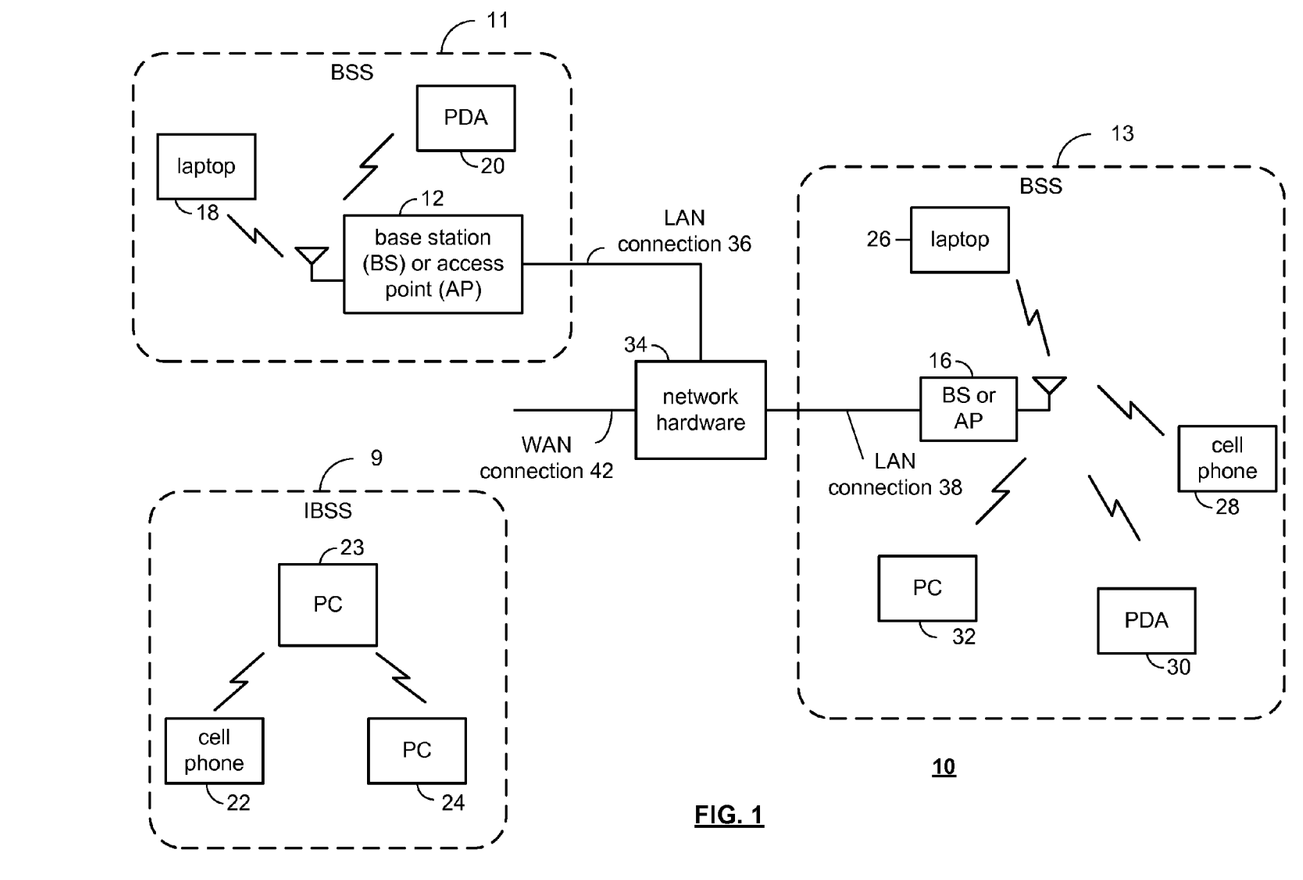
FIG. 1 is a schematic block diagram of a communication system in accordance with the present invention.

FIG. 1 is a schematic block diagram illustrating a communication system 10 that includes a plurality of base stations and/or access points 12, 16, a plurality of wireless communication devices 18-32 and a network hardware component 34. Note that the network hardware 34, which may be a router, switch, bridge, modem, system controller, et cetera provides a wide area network connection 42 for the communication system 10. Further note that the wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIGS. 2 and/or 3.

Wireless communication devices 22, 23, and 24 are located within an independent basic service set (IBSS) area and communicate directly (i.e., point to point). In this configuration, these devices 22, 23, and 24 may only communicate with each other. To communicate with other wireless communication devices within the system 10 or to communicate outside of the system 10, the devices 22, 23, and/or 24 need to affiliate with one of the base stations or access points 12 or 16.

The base stations or access points 12, 16 are located within basic service set (BSS) areas 11 and 13, respectively, and are operably coupled to the network hardware 34 via local area network connections 36, 38. Such a connection provides the base station or access point 12 16 with connectivity to other devices within the system 10 and provides connectivity to other networks via the WAN connection 42. To communicate with the wireless communication devices within its BSS 11 or 13, each of the base stations or access points 12-16 has an associated antenna or antenna array. For instance, base station or access point 12 wirelessly communicates with wireless communication devices 18 and 20 while base station or access point 16 wirelessly communicates with wireless communication devices 26-32. Typically, the wireless communication devices register with a particular base station or access point 12, 16 to receive services from the communication system 10.

Typically, base stations are used for cellular telephone systems and like-type systems, while access points are used for in-home or in-building wireless networks (e.g., IEEE 802.11 and versions thereof, Bluetooth, RFID, and/or any other type of radio frequency based network protocol). Regardless of the particular type of communication system, each wireless communication device includes a built-in radio and/or is coupled to a radio. Note that one or more of the wireless communication devices may include an RFID reader and/or an RFID tag.

Figure 2:
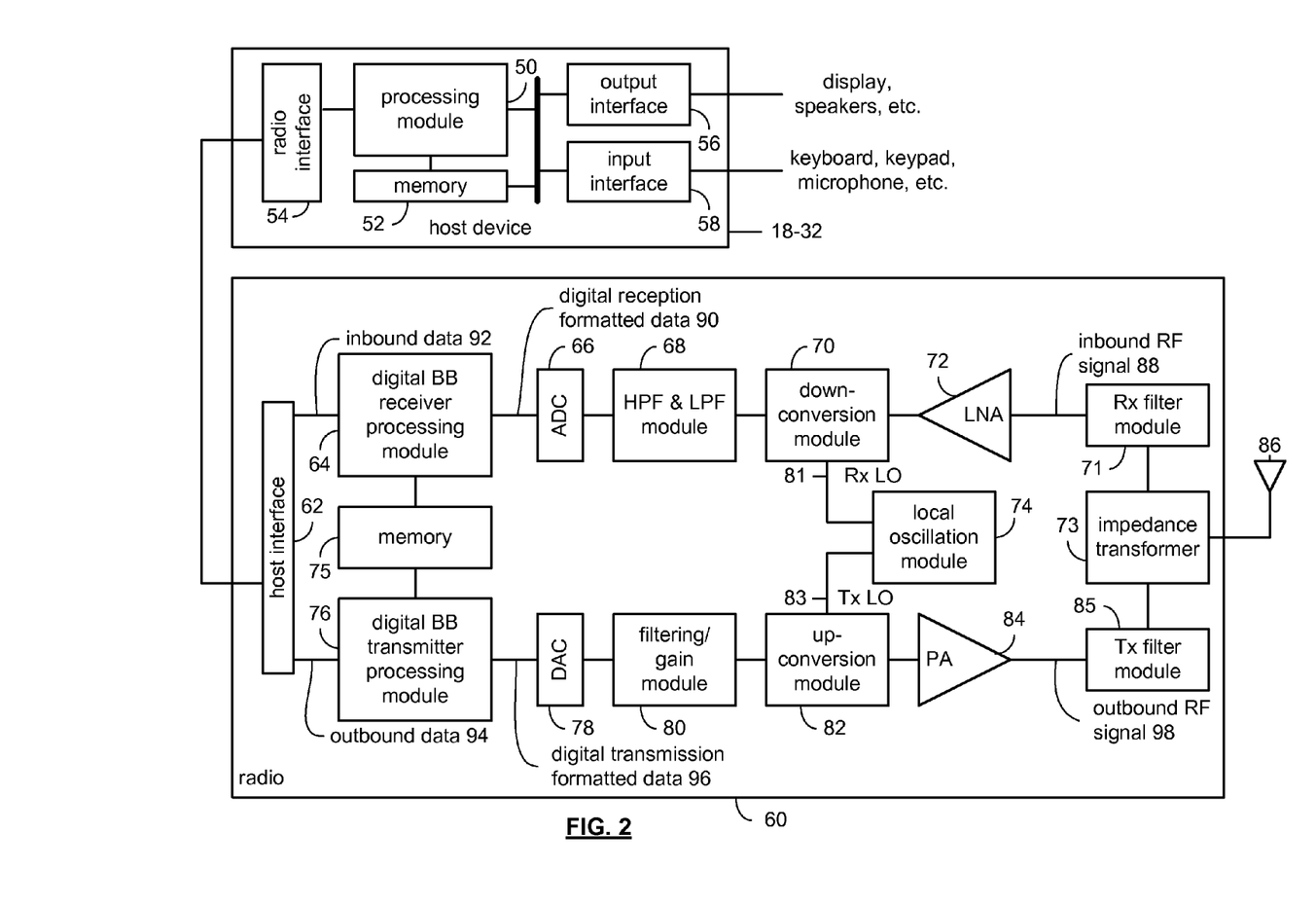
FIG. 2 is a schematic block diagram of an embodiment of a wireless communication device in accordance with the present invention.
Figure 3:
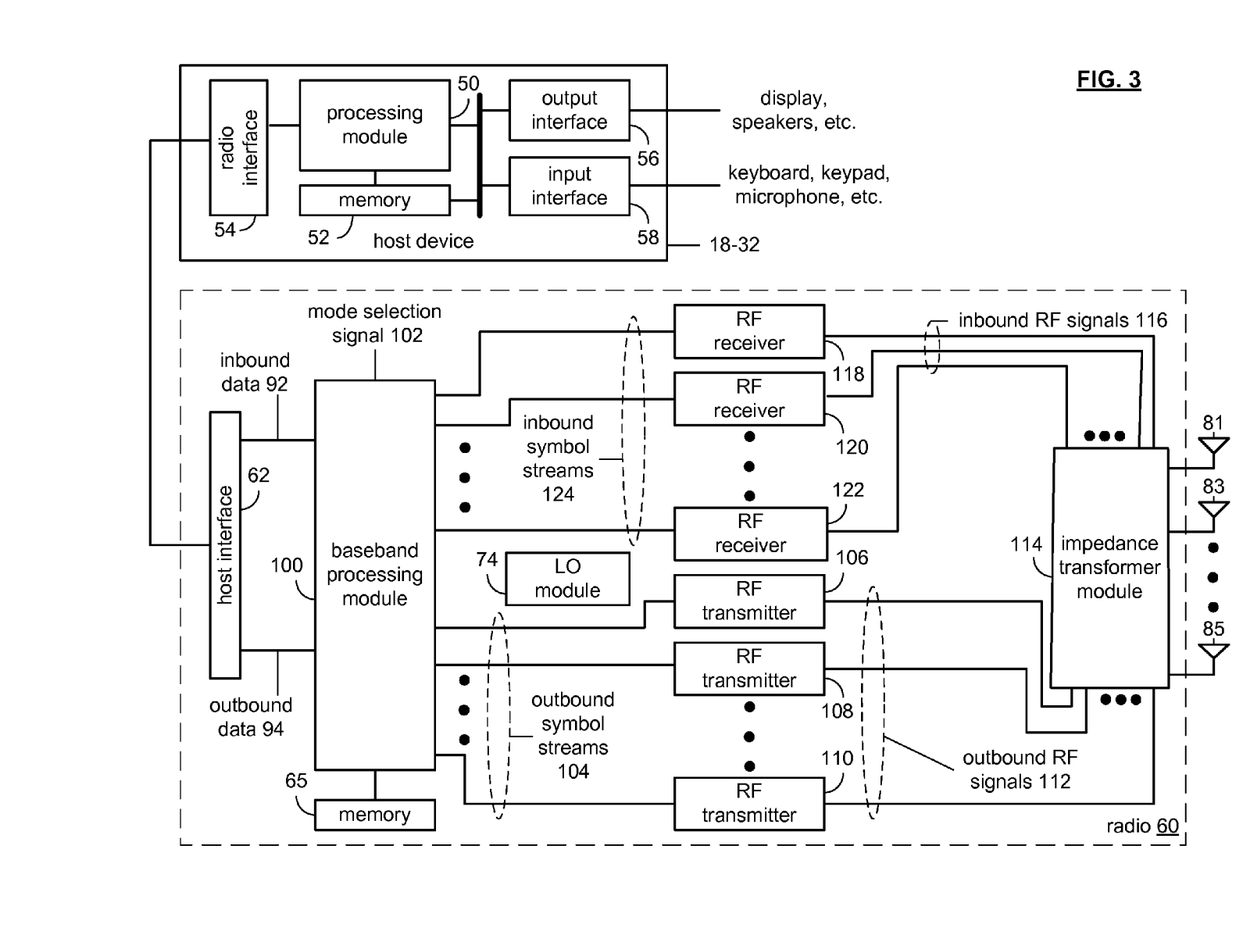
FIG. 3 is a schematic block diagram of another embodiment of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, a radio interface 54, an input interface 58, and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, a local oscillation module 74, memory 75, a receiver path, and a transmitter path, and an impedance transformer 73, which is coupled to antenna 86. The receiver path includes a receiver filter 71, a low noise amplifier 72, a down conversion module 70, a high pass and/or low pass filter module 68, an analog-to-digital converter 66, and a digital receiver processing module 64. The transmit path includes a digital transmitter processing module 76, a digital-to-analog converter 78, a filtering/gain module 80, an up conversion module 82, a power amplifier 84, and a transmitter filter module 85. The antenna 86 may be a single antenna that is shared by the transmit and receive paths coupled to separate differential windings of the impedance transformer 73, or may include separate antennas and corresponding impedance transformers 73 for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, demapping, depuncturing, decoding, and/or descrambling. The digital transmitter functions include, but are not limited to, scrambling, encoding, puncturing, mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11, Bluetooth, RFID, et cetera) to produce outbound baseband signals 96. The outbound baseband signals 96 will be digital base-band signals (e.g., have a zero IF) or a digital low IF signals, where the low IF typically will be in the frequency range of one hundred kilohertz to a few megahertz.

The digital-to-analog converter 78 converts the outbound baseband signals 96 from the digital domain to the analog domain. The filtering/gain module 80 filters and/or adjusts the gain of the analog signals prior to providing it to the up-conversion mixing module 82. The up conversion mixing module 82 converts the analog baseband or low IF signals into RF signals based on a transmitter local oscillation 83 provided by local oscillation module 74. The power amplifier 84 amplifies the RF signals to produce outbound RF signals 98, which are filtered by the transmitter filter module 85. The antenna 86 receives the outbound RF signals 98 from the impedance transformer 73 and transmits them to a targeted device such as a base station, an access point and/or another wireless communication device.

The radio 60 also receives inbound RF signals 88 via the antenna 86, which were transmitted by a base station, an access point, or another wireless communication device. The antenna 86 provides the inbound RF signals 88 to the receiver filter module 71 via the impedance transformer 73 (which may be shared with the transmit path or a separate transformer), where the Rx filter 71 bandpass filters the inbound RF signals 88. The Rx filter 71 provides the filtered RF signals to low noise amplifier 72, which amplifies the signals 88 to produce an amplified inbound RF signals. The low noise amplifier 72 provides the amplified inbound RF signals to the down conversion mixing module 70, which converts the amplified inbound RF signals into an inbound low IF signals or baseband signals based on a receiver local oscillation 81 provided by local oscillation module 74. The down conversion module 70 provides the inbound low IF signals or baseband signals to the filtering/gain module 68. The high pass and low pass filter module 68 filters the inbound low IF signals or the inbound baseband signals to produce filtered inbound signals.

The analog-to-digital converter 66 converts the filtered inbound signals from the analog domain to the digital domain to produce inbound baseband signals 90, where the inbound baseband signals 90 will be digital base-band signals or digital low IF signals, where the low IF typically will be in the frequency range of one hundred kilohertz to a few megahertz.

The digital receiver processing module 64 decodes, descrambles, demaps, and/or demodulates the inbound baseband signals 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76. Still further, the impedance transformer(s) 73 may be fabricated on the supporting structure (e.g., PCB) of the package of the one or more integrated circuits and/or on the supporting structure (e.g., PCB) on which the integrate circuit(s) is mounted.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, memory 64, a receiver path, a transmit path, a local oscillation module 74, and an impedance transformer module 114, which is coupled to a plurality of antennas 81-85. The receive path includes a baseband processing module 100 and a plurality of RF receivers 118-120. The transmit path includes baseband processing module 100 and a plurality of radio frequency (RF) transmitters 106-110. The baseband processing module 100, in combination with operational instructions stored in memory 65 and/or internally operational instructions, executes digital receiver functions and digital transmitter functions, respectively. The digital receiver functions include, but are not limited to, digital intermediate frequency to baseband conversion, demodulation, constellation demapping, depuncturing, decoding, de-interleaving, fast Fourier transform, cyclic prefix removal, space and time decoding, and/or descrambling. The digital transmitter functions include, but are not limited to, scrambling, encoding, puncturing, interleaving, constellation mapping, modulation, inverse fast Fourier transform, cyclic prefix addition, space and time encoding, and digital baseband to IF conversion. The baseband processing modules 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 64 receives the outbound data 88 and, based on a mode selection signal 102, produces one or more outbound symbol streams 90. The mode selection signal 102 will indicate a particular mode of operation that is compliant with one or more specific modes of the various IEEE 802.11, RFID, etc., standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode select signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode select signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode select signal 102 indicates 2, 3 or 4 antennas, the baseband processing module 100 will produce 2, 3 or 4 outbound symbol streams 104 from the outbound data 94.

Depending on the number of outbound streams 104 produced by the baseband module 10, a corresponding number of the RF transmitters 106-110 will be enabled to convert the outbound symbol streams 104 into outbound RF signals 112. The RF transmitters 106-110 provide the outbound RF signals 112 to the impedance transformer module 114, which provides each outbound RF signal to a corresponding antenna 81-85.

When the radio 60 is in the receive mode, the impedance transformer module 114 receives one or more inbound RF signals 116 via the antennas 81-85 and provides them to one or more RF receivers 118-122. Note that the impedance transformer module 114 may include a plurality of impedance transformers. In one embodiment, the impedance transformer module 114 includes two impedance transformers for each antenna: where one is for the receive path and the other is for the transmit path. In another embodiment, the impedance transformer module 114 includes one impedance transformer for each antenna and furthers include a transmit/receive switch for each antenna to selectively coupled the impedance transformer to the receive path or the transmit path. In yet another embodiment, the impedance transformer module 114 includes one impedance transformer for each antenna, where the impedance transformer includes distinct differential winding connections for the receive path and the transmit path.

The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on one integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 4:
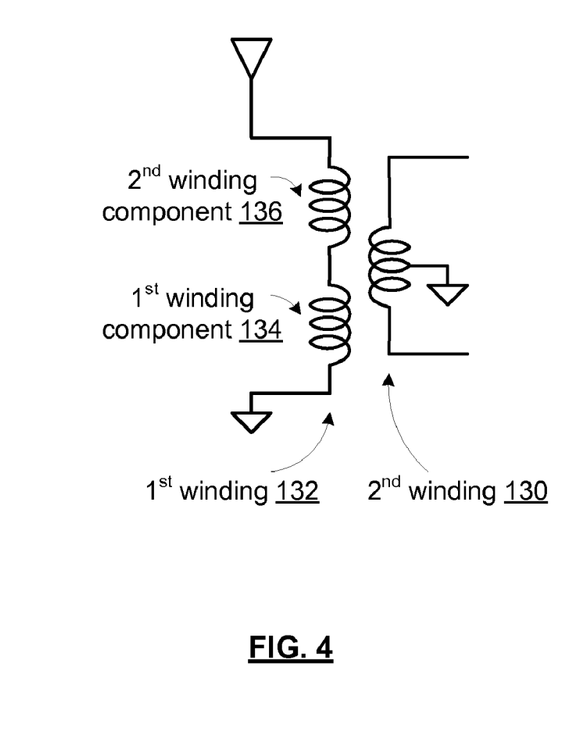
FIG. 4 is a schematic block diagram of an impedance transformer in accordance with the present invention.

FIG. 4 is a schematic block diagram of an impedance transformer that may be used as impedance transformer 73 of FIG. 2 or one of the impedance transformers in the impedance transformer module 114 of FIG. 3. In this embodiment, the impedance transformer includes a first winding 132 and a second winding 130. The first winding 132 includes a series combination of a first winding component 134 and a second winding component 136 to produce a single-ended winding. As shown, the single-ended winding may be coupled to an antenna and, while not shown, the differential winding may be coupled to an output of a power amplifier and/or to an input of a low noise amplifier.

The impedance transformer of FIG. 4 may be fabricated on a supporting substrate (e.g., an integrated circuit package substrate such as a printed circuit board (PCB), a low temperature co-fired ceramic (LTCC), or an organic substrate) in a variety of ways. For example, the first winding component 134 may be on a first layer of the supporting substrate, the second winding component 136 may be on a third layer of the supporting substrate, and the second winding 130 may be on a second layer of the supporting substrate. In this example, the first and second winding components 134 and 136 are interleaved with the second winding 130. In addition, the first winding 132 has a first impedance (e.g., 50 Ohms) within a desired frequency range (e.g., around 900 MHz, around 2.4 GHz, around 5.1 GHz, and around 5.75 GHz) and the second winding 130 has a second impedance (e.g., 12.5 Ohms) within the desired frequency range. Further, the first and second impedances are based on spacing, trace width, and/or trace length of the first winding component 134, the second winding component 136, and the second winding 130.

Figure 5:
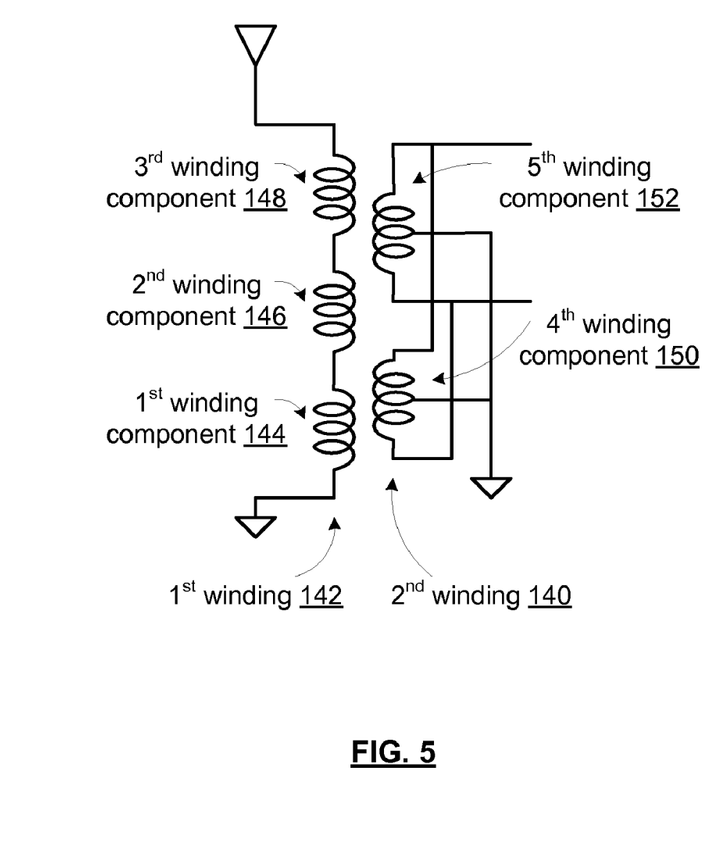
FIG. 5 is a schematic block diagram of another impedance transformer in accordance with the present invention.

FIG. 5 is a schematic block diagram of another impedance transformer that may be used as impedance transformer 73 of FIG. 2 or one of the impedance transformers in the impedance transformer module 114 of FIG. 3. In this embodiment, the impedance transformer includes a first winding 142 and a second winding 140. The first winding 132 includes a series combination of a first winding component 144, a second winding component 146, and a third winding component 148 to produce a single-ended winding. The second winding 140 includes a parallel combination of a fourth winding component 150 and a fifth winding component 152. As shown, the single-ended winding may be coupled to an antenna and, while not shown, the differential winding may be coupled to an output of a power amplifier and/or to an input of a low noise amplifier.

The impedance transformer of FIG. 5 may be fabricated on a supporting substrate (e.g., PCB, LTCC, or an organic substrate) in a variety of ways. For example, the first winding component 144 may be on a first layer of the supporting substrate, the second winding component 146 may be on a third layer of the supporting substrate, the third winding component 148 may be on a fifth layer of the supporting substrate, the fourth winding component 150 may be on a second layer of the supporting substrate, and the fifth winding component 152 may be on a fourth layer of the supporting substrate. In this example, the first, second, and third winding components 144 146 148 are interleaved with the fourth and fifth winding components 150 152. In addition, the first winding 142 has a first impedance (e.g., 50 Ohms) within a desired frequency range (e.g., 890-910 MHz, 2.40-2.42 GHz, 5.0 GHz-5.85 GHz) and the second winding 140 has a second impedance (e.g., 12.5 Ohms) within the desired frequency range. Further, the first and second impedances are based on spacing, trace width, and/or trace length of the first, second, third, fourth, and fifth winding component 144-152.

Figure 6:
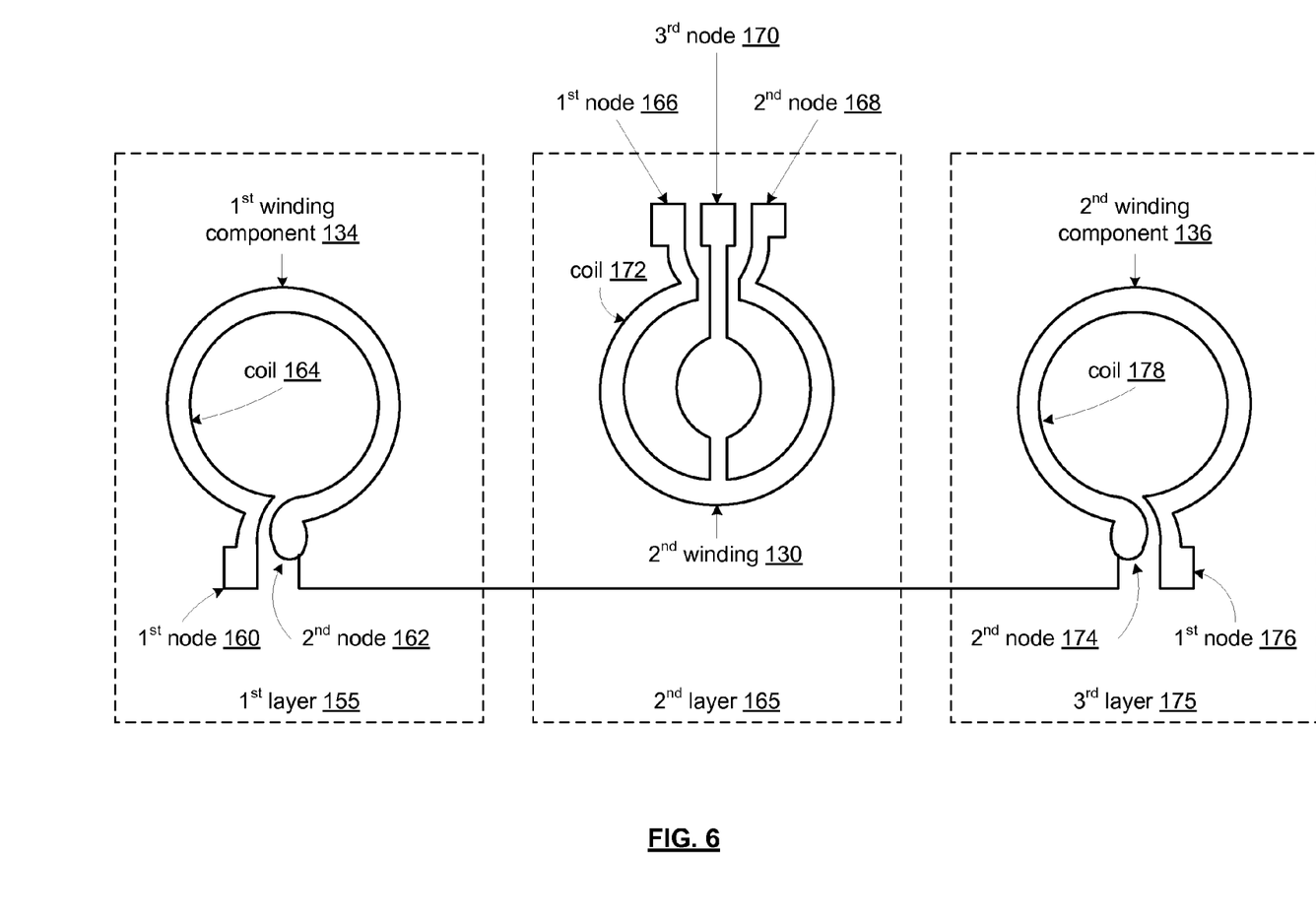
FIG. 6 is a diagram of winding components and layers of an impedance transformer in accordance with the present invention.

FIG. 6 is a diagram of example winding components and layers of the impedance transformer of FIG. 4. In this example, the supporting substrate includes at least three layers ($1^{st}$ layer 155, $2^{nd}$ layer 165, and $3^{rd}$ layer 175). The first winding component 134 is on the first layer 155, the second winding 130 is on the second layer 165 and the second winding component 136 is on the third layer 175. Note that the first and second winding components 134 and 136 and the second winding 130 may be traces on a PCB, which may be the PCB of a package of a radio frequency integrated circuit. Further note that the trace thickness, width, and/or length may be selected based on properties of the PCB to provide desired electro-magnetic properties within a given frequency range. For example, if the PCB is an FR4 PCB, its properties may include a dielectric constant, a tangential loss, a PCB thickness, minimum trace width, minimum trace spacing, minimum via-hole diameter, and/or metal conductivity of the traces.

In this example, the first winding 134 includes a first node 160, a second node 162 and a coil 164. The first and second nodes 160 and 162 are coupled to end points of the coil, which has a substantially encircling geometric shape. In this example, the substantially encircling geometric shape is circular, but in alternate embodiments it could be an oval, a square, a hexagon, an octagon, etc. The second winding component 136 includes a first node 176, a second node 174, and a coil 178. The first and second nodes 176 and 174 are coupled to end points of the coil 178, which has a mirroring substantially encircling geometric shape. The mirroring substantially encircling geometric shape is essentially a minor image of the substantially encircling geometric shape, where, from a perpendicular perspective to the supporting substrate, the second nodes 162 and 174 may be connected by a via to produce the series combination of the first and second winding components.

The second winding 130 includes a first node 166, a second node 168, a third node 170, and a coil 172. The first and second nodes 166 and 168 are coupled to end points of the coil 172 and the third node 170 is coupled to a center point of the coil 172. In this example, the coil 172 has a complimentary substantially encircling geometric shape. The complimentary substantially encircling geometric shape has essentially the same shape as the substantially encircling geometric shape, where, from a perpendicular perspective to the supporting substrate, the coils 164 and 178 of the first winding substantially overlay the coil 172 of the second winding.

Figure 7:
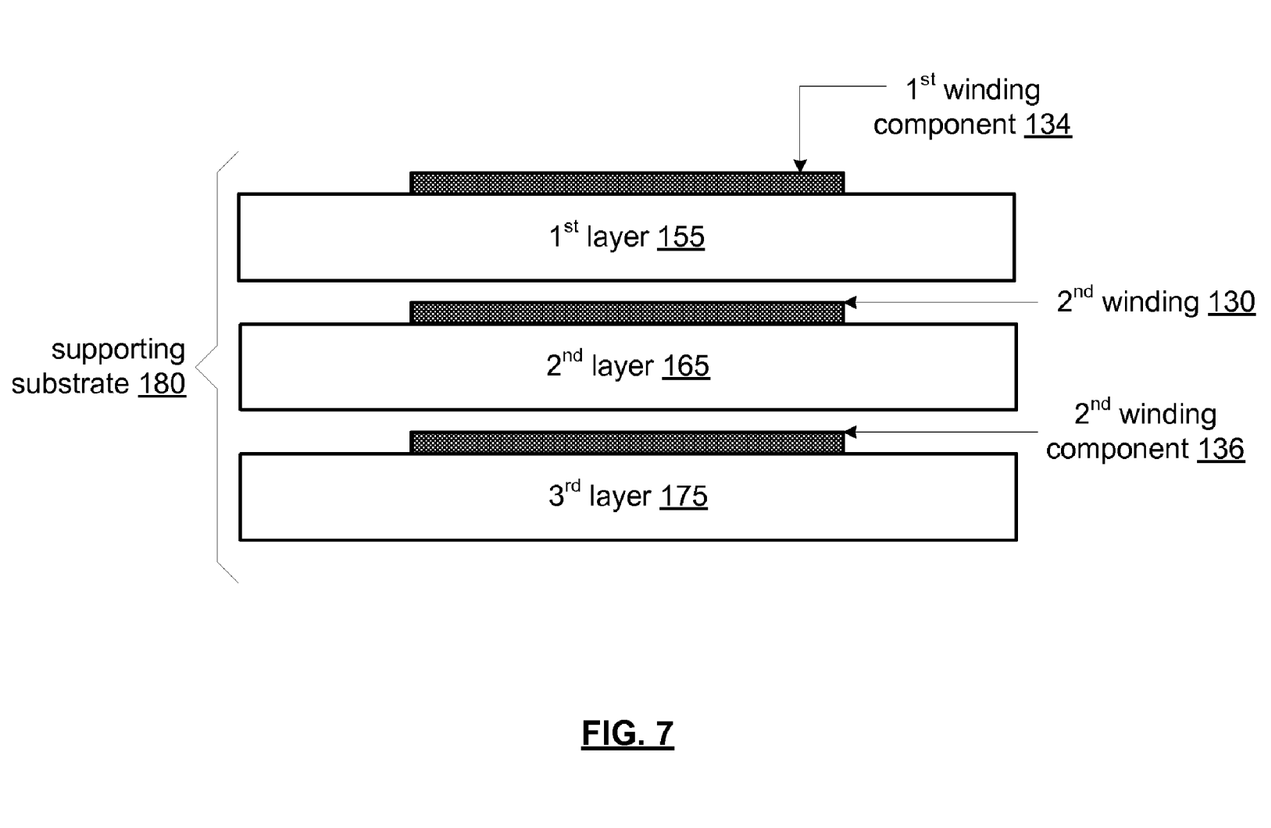
FIG. 7 is a side perspective diagram of the impedance transformer of FIG. 6.

FIG. 7 is a side perspective diagram of the impedance transformer of FIG. 6. In this embodiment, the supporting structure 180 includes at least three layers: first layer 155, second layer 165, and third layer 175. The first winding component 134 of the single-ended winding is on the first layer 155, the second winding 130 (i.e., the differential winding) is on the second layer 165 and the second winding component 136 of the single-ended winding is on the third layer 175. The windings may be fabricated on the corresponding layers in a variety of ways depending on the material of the supporting substrate. For example, if the supporting substrate is a multi-layer PCB, the windings may be metal traces formed by etching or deposition.

As is shown, the windings 134, 130, and 136, from a perpendicular perspective to the supporting substrate, overlay each other, wherein the first and second winding components 134 and 136 are interleaved with the second winding 130. In this embodiment, the windings 134, 130, and 136 substantially overlay each other where, in combination with the trace length, width, and thickness of the windings and the properties of the supporting substrate, provide a desired capacitance between the windings, a desired electro-magnetic coupling between the windings, and hence a desired impedance of the windings. In alternative embodiments, the overlay of the windings may be offset to change the capacitance and/or electro-magnetic coupling.

Figure 8:
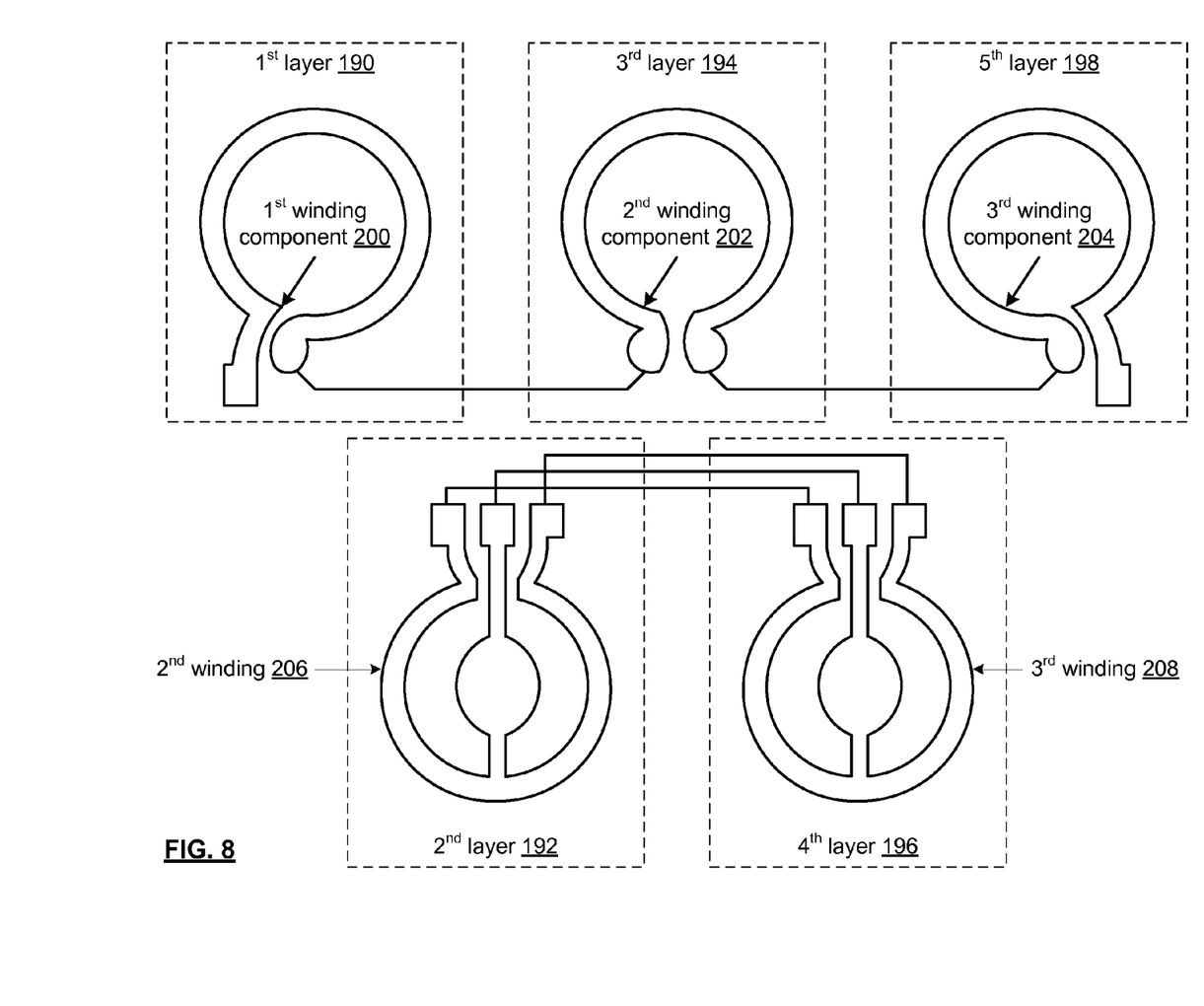
FIG. 8 is a diagram of winding components and layers of another impedance transformer in accordance with the present invention.

FIG. 8 is a diagram of example winding components and layers of the impedance transformer of FIG. 5. In this example, the supporting substrate includes at least five layers ($1^{st}$ layer 190, $2^{nd}$ layer 192, $3^{rd}$ layer 194, $4^{th}$ layer 195, and $5^{th}$ layer 198). The first winding component 200 is on the first layer 190, the second winding 206 is on the second layer 192, the second winding component 202 is on the third layer 194, the third winding 208 is on the fourth layer 196, and the third winding component 204 is on the fifth layer 198. Note that the first, second, and third winding components 200-204 and the second and third windings 206 and 208 may be traces on a PCB, which may be the PCB of a package of a radio frequency integrated circuit. Further note that the trace thickness, width, and/or length may be selected based on properties of the PCB to provide desired electro-magnetic properties within a given frequency range.

In this example, each of the first, second, and third winding components 200-204 include a first node, a second node, and a coil. As shown, the first and second nodes are coupled to end points of the coil. Note that the coil of the first winding component has a substantially encircling geometric shape, the coil of the second winding component has an interconnecting substantially encircling geometric shape, and the coil of the third winding component has a mirroring substantially encircling geometric shape. In this example, the encircling geometric shape of the coils is circular, but in alternate embodiments it could be an oval, a square, a hexagon, an octagon, etc.

As is further shown in this example, each of the second and third windings 206 and 208 include three nodes and a coil. Two of the nodes are coupled to end points of the coil and the other node is coupled to a center point of the coil, which has a complimentary substantially encircling geometric shape. The second and third windings 206 and 208 are coupled in parallel to provide a differential winding, while the first, second, and third winding components 200-204 are coupled in series. Note that the lines coupling the second and third windings 206 and 208 in parallel and the lines coupling the first, second, and third winding components 200-204 in series may be vias on the supporting substrate.

Figure 9:
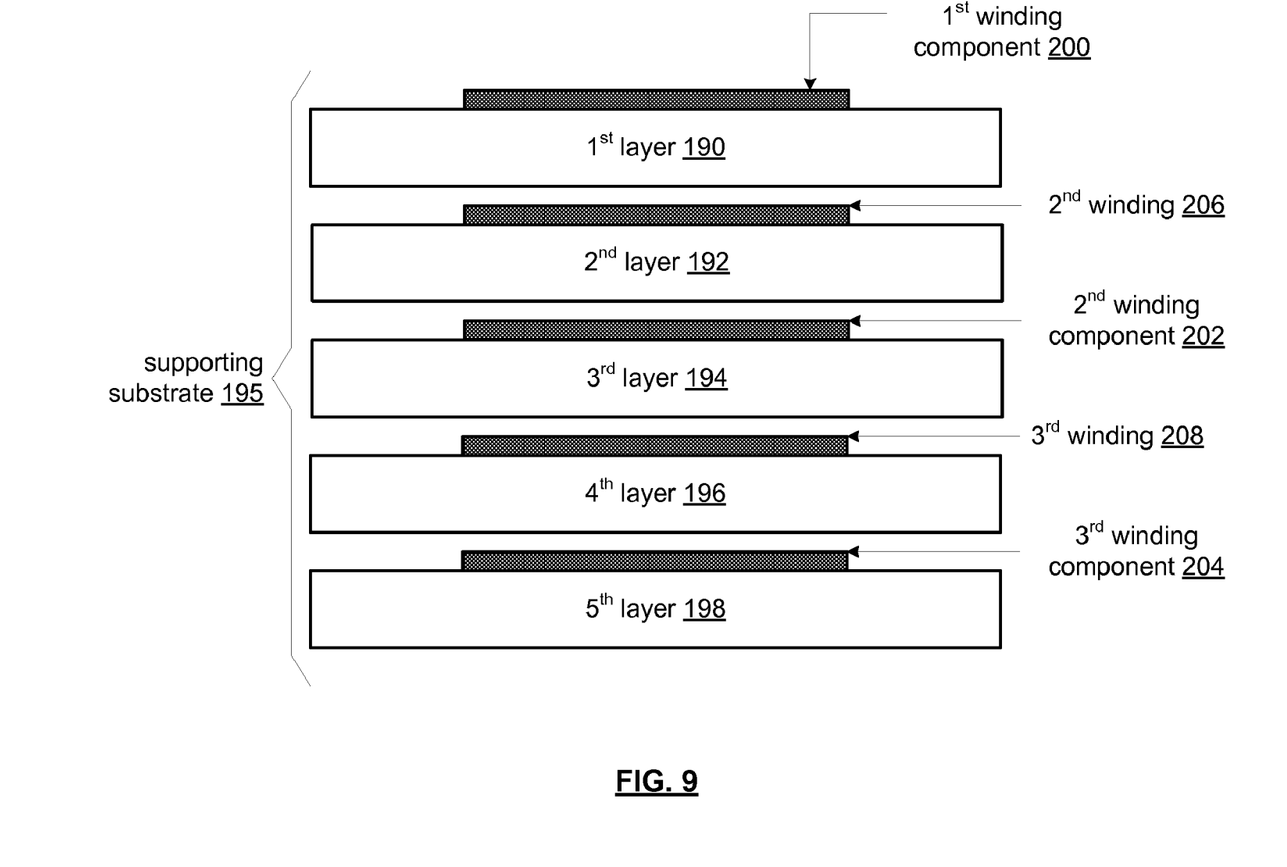
FIG. 9 is a side perspective diagram of the impedance transformer of FIG. 8.

FIG. 9 is a side perspective diagram of the impedance transformer of FIG. 8. In this embodiment, the supporting structure 195 includes at least five layers: first layer 190, second layer 192, third layer 194, fourth layer 196, and fifth layer 198. The first winding component 200 of the single-ended winding is on the first layer 190, the second winding 206 of the differential winding is on the second layer 192, the second winding component 20 of the single-ended winding is on the third layer 194, the third winding 208 of the differential winding is on the fourth layer 196, and the third winding component 204 of the single-ended winding is on the fifth layer 198. The windings 200-208 may be fabricated on the corresponding layers in a variety of ways depending on the material of the supporting substrate. For example, if the supporting substrate is a multi-layer PCB, the windings may be metal traces formed by etching or deposition.

As is shown, the windings 200-208, from a perpendicular perspective to the supporting substrate, overlay each other, wherein the first, second, and third winding components 200-204 are interleaved with the second and third windings 206 and 208. In this embodiment, the windings 200-208 substantially overlay each other where, in combination with the trace length, width, and thickness of the windings and the properties of the supporting substrate, provide a desired capacitance between the windings, a desired electro-magnetic coupling between the windings, and hence a desired impedance of the windings. In alternative embodiments, the overlay of the windings may be offset to change the capacitance and/or electro-magnetic coupling.

Figure 10:
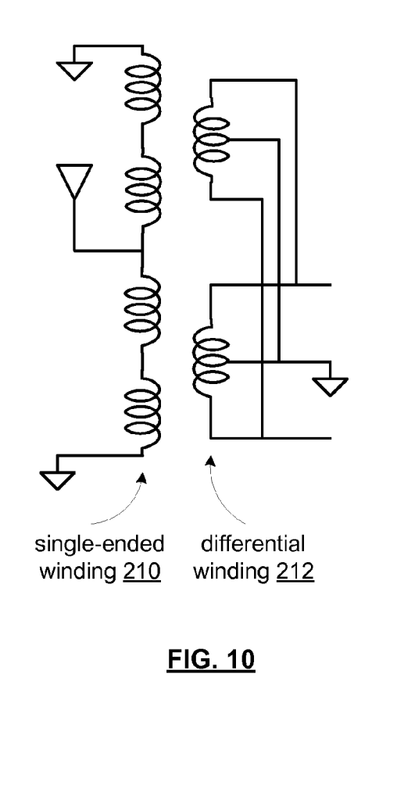
FIG. 10 is a schematic block diagram of yet another impedance transformer in accordance with the present invention.

FIG. 10 is a schematic block diagram of yet another impedance transformer that includes a single-ended winding 210 and a differential winding 212. The single-ended winding 210 includes a plurality of winding components (shown schematically as inductors) on a first set of layers of a supporting substrate. In this embodiment, each layer of the first set of layers supports two winding components of the plurality of winding components. To provide the single-ended winding, the plurality of winding components is coupled in series.

The differential winding 212 includes windings on at least one other layer of the supporting substrate. In one embodiment, the at least one other layer is interleaved with the first set of layers. Note that the single-ended winding has a first impedance (e.g., 50 Ohms) within a desired frequency range (e.g., around 900 MHz, around 2.4 GHz, around 5.1 GHz, and around 5.75 GHz) and the differential winding has a second impedance (e.g., 6.25 Ohms) within the desired frequency range. Further note that the first and second impedances are based on at least one of spacing, trace width, and trace length of the single-ended and differential windings.

Figure 11:
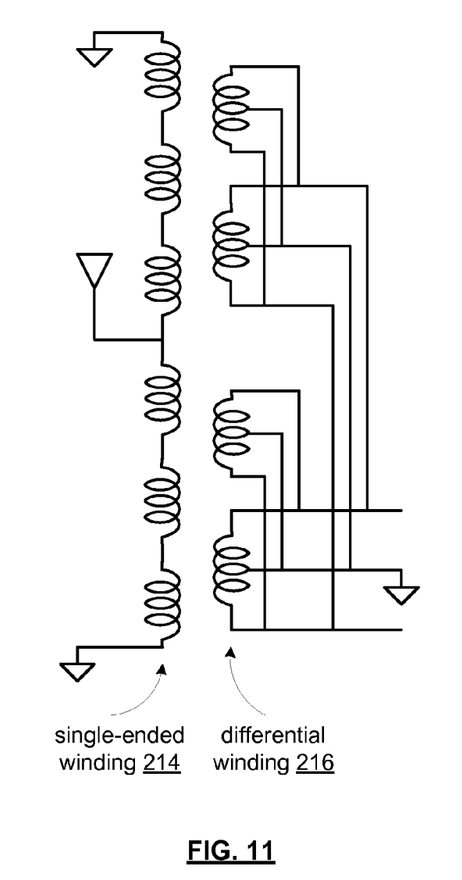
FIG. 11 is a schematic block diagram of still another impedance transformer in accordance with the present invention.

FIG. 11 is a schematic block diagram of still another impedance transformer that includes a single-ended winding 214 and a differential winding 216. The single-ended winding 210 includes a plurality of winding components (shown schematically as inductors) that are on a first set of layers of a supporting substrate. In this embodiment, each layer of the first set of layers supports two winding components of the plurality of winding components. To provide the single-ended winding, the plurality of winding components is coupled in series.

The differential winding 214 includes a plurality of winding components on a second set of layers of the supporting substrate. In one embodiment, the second set of layers is interleaved with the first set of layers. Note that the single-ended winding has a first impedance (e.g., 50 Ohms) within a desired frequency range (e.g., around 900 MHz, around 2.4 GHz, around 5.1 GHz, and around 5.75 GHz) and the differential winding has a second impedance (e.g., 6.25 Ohms) within the desired frequency range. Further note that the first and second impedances are based on at least one of spacing, trace width, and trace length of the single-ended and differential windings.

Figure 12:
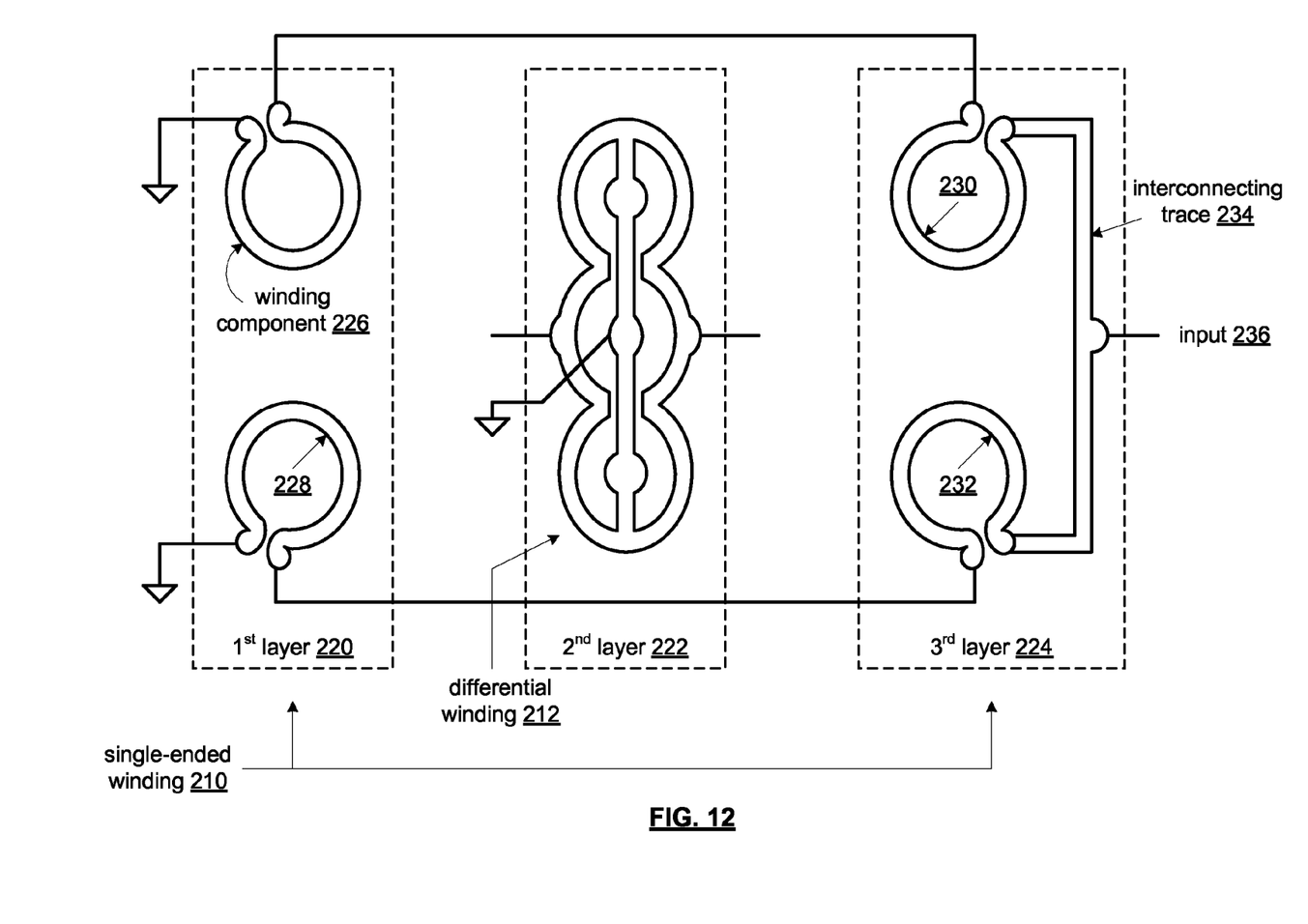
FIG. 12 is a diagram of winding components and layers of yet another impedance transformer in accordance with the present invention.

FIG. 12 is a diagram of windings and layers of the impedance transformer of FIG. 10. In this illustration, the supporting substrate includes at least three layers; first layer 220, second layer 222, and third layer 224. In one embodiment, the single-ended winding 210 includes winding components 226 and 228 on the first layer 220 and winding components 230 and 232 on the third layer 224. In this embodiment, the differential winding 212 is on the second layer 222, which is interleaved with the first and third windings 220 and 224.

As shown, each of the plurality of winding components 226-232 of the single-ended winding 210 includes a first node, a second node and a coil. The first and second nodes are coupled to end points of the coil, which has a substantially encircling geometric shape, a mirroring substantially encircling geometric shape, an interconnecting substantially encircling geometric shape, or a mirroring interconnecting substantially encircling geometric shape. For example, the coil of winding component 226 has a substantially encircling geometric shape, the coil of winding component 228 has a mirroring substantially encircling geometric shape, the coil of winding component 230 has an alternate mirroring substantially encircling geometric shape, and the coil of winding component 232 has yet another alternate mirroring substantially encircling geometric shape. In this example, the substantially encircling geometric shape is circular, but in alternate embodiments it could be an oval, a square, a hexagon, an octagon, etc.

The single-ended winding 210 further includes an interconnecting trace 234 on the third layer (i.e., an end layer of the first set of layers) that provides an input of the single-ended winding 210. The other input of the single-ended winding is provided by the nodes of winding components 226 and 228 that are coupled to ground. Note that the lines coupling winding component 226 to winding component 230 and coupling winding component 228 to winding component 232 may be vias on a PCB. Further note that the winding components 226-232 may be metal traces on the PCB.

The differential winding 212 includes a composite substantially encircling geometric shape. As shown, the differential winding is symmetrical about its X axis center and its Y axis center. Note that the trace thickness, width, and/or length of the windings 212 and 226-232 may be selected based on properties of the PCB to provide desired electro-magnetic properties within a given frequency range. For example, if the PCB is an FR4 PCB, its properties may include a dielectric constant, a tangential loss, a PCB thickness, minimum trace width, minimum trace spacing, minimum via-hole diameter, and/or metal conductivity of the traces.

Figure 13:
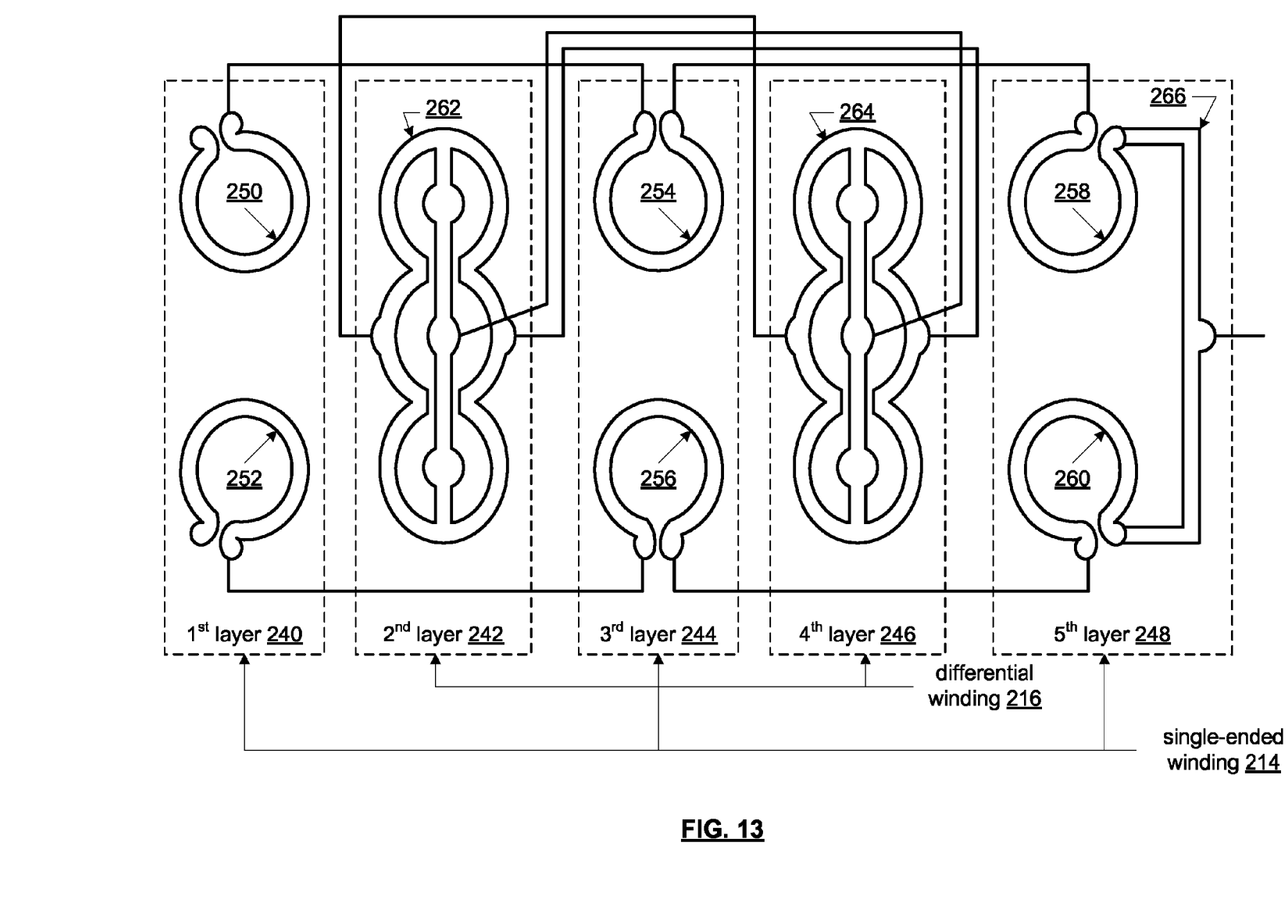
FIG. 13 is a diagram of winding components and layers of still another impedance transformer in accordance with the present invention.

FIG. 13 is a diagram of winding windings and layers of the impedance transformer of FIG. 11. In this illustration, the supporting substrate includes at least five layers; first layer 240, second layer 242, third layer 244, fourth layer 246, and fifth layer 248. In one embodiment, the single-ended winding 214 includes winding components 250 and 252 on the first layer 240, winding components 254 and 256 on the third layer 244, and winding components 258 and 260 on the fifth layer 248. In this embodiment, the differential winding 216 includes a winding component 262 on the second layer 242 and another winding component 264 on the fourth layer 246. Note that second and fourth layers 242 and 246 are interleaved with the first, third, and fifth layers 240, 244, and 248.

As shown, each of the plurality of winding components 250-260 of the single-ended winding 214 includes a first node, a second node and a coil. The first and second nodes are coupled to end points of the coil, which has a substantially encircling geometric shape, a minoring substantially encircling geometric shape, an interconnecting substantially encircling geometric shape, or a minoring interconnecting substantially encircling geometric shape. For example, the coil of winding component 250 has a substantially encircling geometric shape, the coil of winding component 252 has a minoring substantially encircling geometric shape, the coil of winding component 258 has an alternate mirroring substantially encircling geometric shape, the coil of winding component 260 has yet another alternate mirroring substantially encircling geometric shape, the coil of winding component 254 has an interconnecting substantially encircling geometric shape, and the coil of winding component 256 has a minoring interconnecting substantially encircling geometric shape. In this example, the substantially encircling geometric shape is circular, but in alternate embodiments it could be an oval, a square, a hexagon, an octagon, etc.

The single-ended winding 214 further includes an interconnecting trace 266 on the fifth layer 248 (which is an end layer of the first set of layers) that provides an input of the single-ended winding 214. The other input of the single-ended winding is provided by the nodes of winding components 250 and 252 that are coupled to ground. Note that the lines coupling winding components 250 and 254, 254 and 258, 260 and 256, and 252 and 256 may be vias on a PCB. Further note that the winding components 250-260 may be metal traces on the PCB.

The differential winding 216 includes two winding components 262 and 264 that each has a composite substantially encircling geometric shape. As shown, the differential winding is symmetrical about its X axis center and its Y axis center. Note that the trace thickness, width, and/or length of the single-ended and differential windings 214 and 216 may be selected based on properties of the PCB to provide desired electro-magnetic properties within a given frequency range. For example, if the PCB is an FR4 PCB, its properties may include a dielectric constant, a tangential loss, a PCB thickness, minimum trace width, minimum trace spacing, minimum via-hole diameter, and/or metal conductivity of the traces.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "operably associated with", as may be used herein, includes direct and/or indirect coupling of separate components and/or one component being embedded within another component. As one of ordinary skill in the art will still further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented various embodiments of an impedance transformer. As one of ordinary skill in the art will appreciate, other embodiments may be derived from the teachings of the present invention without deviating from the scope of the claims.

What is claimed is:

1. An apparatus comprising:
a first winding side of a transformer having a plurality of winding components, in which the winding components of the first winding side are disposed on a first set of alternating supporting substrate layers, wherein each supporting substrate layer of the first set of supporting substrate layers supports at least two winding components of the plurality of winding components and wherein the plurality of winding components of the first winding side are electrically coupled together; and
a second winding side of the transformer having a plurality of winding components, in which the winding components of the second winding side are disposed on a second set of substrate supporting layer or layers that are interleaved between the first set of supporting substrate layers, wherein the winding components of the second winding side are disposed as a composite substantially encircling geometric shape, such that from a perpendicular perspective with respect to the first and second set of supporting substrate layers, the winding components of the first winding side and winding components of the second winding are respectively overlayed.

2. The apparatus of claim 1, wherein the winding components of the second winding side are configured as differential windings.

3. The apparatus of claim 1, wherein the winding components of the first winding side are configured as single-ended windings and the winding components of the second winding side are configured as differential windings.

4. The apparatus of claim 3, wherein the winding components of the first winding side are disposed on a first and third supporting substrate layers and the winding components of the second winding side are disposed on a second supporting substrate layer that resides between the first and third supporting substrate layers.

5. The apparatus of claim 3, wherein the winding components of the first winding side are disposed on a first, third and fifth supporting substrate layers and the winding components of the second winding side are disposed on a second and fourth supporting substrate layers that reside between the first, third and fifth supporting substrate layers.

6. The apparatus of claim 1, wherein the first and second sets of supporting substrate layers are formed from a printed circuit board.

7. The apparatus of claim 1, wherein the first and second sets of supporting substrate layers are formed from a low temperature co-fired ceramic.

8. The apparatus of claim 1, wherein the first and second sets of supporting substrate layers are formed from an organic substrate.

9. The apparatus of claim 1, wherein the winding components of the first winding side has a first impedance within a desired frequency range and the winding components of the second winding side has a second impedance within the desired frequency range.

10. An apparatus comprising:
a radio frequency (RF) front-end integrated on an integrated circuit chip, in which the RF front-end couples to an antenna; and
an impedance transformer coupled between the RF front-end and the antenna, the impedance transformer constructed to have:
a first winding side having a plurality of winding components, in which the winding components of the first winding side are disposed on a first set of alternating supporting substrate layers, wherein each supporting substrate layer of the first set of supporting substrate layers supports at least two winding components of the plurality of winding components and wherein the plurality of winding components of the first winding side are electrically coupled together; and
a second winding side having a plurality of winding components, in which the winding components of the second winding side are disposed on a second set of substrate supporting layer or layers that are interleaved between the first set of supporting substrate layers, wherein the winding components of the second winding side are disposed as a composite substantially encircling geometric shape, such that from a perpendicular perspective with respect to the first and second set of supporting substrate layers, the winding components of the first winding side and winding components of the second winding are respectively overlayed.

11. The apparatus of claim 10, wherein the winding components of the second winding side are configured as differential windings.

12. The apparatus of claim 10, wherein the winding components of the first winding side are configured as single-ended windings and the winding components of the second winding side are configured as differential windings.

13. The apparatus of claim 12, wherein the winding components of the first winding side are disposed on a first and third supporting substrate layers and the winding components of the second winding side are disposed on a second supporting substrate layer that resides between the first and third supporting substrate layers.

14. The apparatus of claim 12, wherein the winding components of the first winding side are disposed on a first, third and fifth supporting substrate layers and the winding components of the second winding side are disposed on a second and fourth supporting substrate layers that reside between the first, third and fifth supporting substrate layers.

15. The apparatus of claim 10, wherein the first and second sets of supporting substrate layers are formed from a printed circuit board.

16. The apparatus of claim 10, wherein the first and second sets of supporting substrate layers are formed from a low temperature co-fired ceramic.

17. The apparatus of claim 10, wherein the first and second sets of supporting substrate layers are formed from an organic substrate.

18. The apparatus of claim 10, wherein the winding components of the first winding side has a first impedance within a desired frequency range and the winding components of the second winding side has a second impedance within the desired frequency range.

* * * * *